United States Patent
Gonohe et al.

(10) Patent No.: US 8,158,198 B2
(45) Date of Patent: *Apr. 17, 2012

(54) METHOD FOR FORMING TANTALUM NITRIDE FILM

(75) Inventors: Narishi Gonohe, Shizuoka-ken (JP);
Satoru Toyoda, Shizuoka-ken (JP);
Harunori Ushikawa, Shizuoka-ken (JP);
Tomoyasu Kondo, Shizuoka-ken (JP);
Kyuzo Nakamura, Kanagawa-ken (JP)

(73) Assignee: ULVAC, Inc., Kanagawa (JP)

( * ) Notice: Subject to any disclaimer, the term of this patent is extended or adjusted under 35 U.S.C. 154(b) by 812 days.

This patent is subject to a terminal disclaimer.

(21) Appl. No.: 11/885,399

(22) PCT Filed: Mar. 3, 2006

(86) PCT No.: PCT/JP2006/304070
§ 371 (c)(1),
(2), (4) Date: Nov. 26, 2008

(87) PCT Pub. No.: WO2006/093260
PCT Pub. Date: Sep. 8, 2006

(65) Prior Publication Data
US 2009/0246375 A1    Oct. 1, 2009

(30) Foreign Application Priority Data
Mar. 3, 2005 (JP) ................. 2005-059083

(51) Int. Cl.
*C23C 16/00* (2006.01)

(52) U.S. Cl. ............ 427/248.1; 427/255.23; 427/255.28
(58) Field of Classification Search ............... 427/248.1, 427/255.28, 255.23
See application file for complete search history.

(56) References Cited

U.S. PATENT DOCUMENTS
6,297,147 B1 * 10/2001 Yang et al. ............ 438/627
(Continued)

FOREIGN PATENT DOCUMENTS
JP    10-135155 A    5/1998
(Continued)

OTHER PUBLICATIONS
Cho et al. Jpn. J. Appl. Phys. 1998 vol. 37 pp. 6502-6505.*
(Continued)

*Primary Examiner* — Kelly M Gambetta
(74) *Attorney, Agent, or Firm* — Arent Fox LLP

(57) ABSTRACT

A tantalum nitride film-forming method comprises the steps of introducing a raw gas consisting of a coordination compound constituted by an elemental tantalum (Ta) having a coordinated ligand represented by the general formula: N=(R,R') (in the formula, R and R' may be the same or different and each represents an alkyl group having 1 to 6 carbon atoms), and a halogen gas into a vacuum chamber; and reacting these components with one another on a substrate to thus form a surface adsorption film comprising a monoatomic or multi (several)-atomic layer and composed of a compound represented by the following general formula: $TaN_x(Hal)_y(R, R')_z$ (in the formula, Hal represents a halogen atom), then introducing radicals generated from an H atom-containing compound to thus remove Ta—N bonds present in the resulting compound through breakage thereof and remove, at the same time, the remaining R(R') groups bonded to the N atoms present in the compound through the cleavage thereof and to thus form a tantalum nitride film rich in tantalum atoms. The resulting tantalum nitride film has a low resistance, low contents of C and N atoms, and a high compositional ratio: Ta/N, can ensure sufficiently high adherence to the distributing wire-forming film and can thus be useful as a barrier film. Moreover, tantalum particles are implanted in the resulting film according to the sputtering technique to thus further enrich the film with tantalum.

13 Claims, 7 Drawing Sheets

U.S. PATENT DOCUMENTS

| | | | |
|---|---|---|---|
| 2003/0091739 A1* | 5/2003 | Sakamoto et al. | 427/248.1 |
| 2004/0219784 A1* | 11/2004 | Kang et al. | 438/653 |
| 2005/0106865 A1* | 5/2005 | Chung et al. | 438/685 |

FOREIGN PATENT DOCUMENTS

| | | |
|---|---|---|
| JP | 11-054459 | 2/1999 |
| JP | 2003-318174 | 11/2003 |
| JP | 2003-342732 A | 12/2003 |
| JP | 2004-006856 | 1/2004 |
| JP | 2005-203569 A | 7/2005 |

OTHER PUBLICATIONS

Kwang-Nam Cho et al.; "Remote Plasma-Assisted Metal Organic Chemical Vapor Deposition of Tantalum Nitride Thin Films with Different Radicals"; Jpn.J.Appl.Phys.; 1998; vol. 37; pp. 6502-6505.

Seoung Gon Park et al.; "Stability of Plasma Posttreated Tin Films Prepared by Alternating Cyclic Pulses of Tetrakis-Dimethylamido-Titanium and Ammonia", Jpn.J.Appl.Phys.; 2004; vol. 43; pp. 303-304.

* cited by examiner

METHOD FOR FORMING TANTALUM NITRIDE FILM

CROSS-REFERENCE TO RELATED APPLICATION

This application is a National Stage entry of International Application No. PCT/JP2006/304070, filed Mar. 3, 2006, the entire specification claims and drawings of which are incorporated herewith by reference.

TECHNICAL FIELD

The present invention relates to a method for forming a tantalum nitride film and, in particular, to a method for forming, according to the ALD technique (Atomic Layer Deposition technique), a tantalum nitride film useful as a barrier film for distributing wire-forming films, or electrical connection-forming films.

BACKGROUND ART

Recently, there has increasingly been desired for the development of a technique which permits the more finely processing step with respect to the thin film-forming technique used in the field of the semiconductor and this results in the occurrence of a variety of related problems.

In an example of the technique for forming electrical connections of a thin film in a semiconductor device, copper has mainly be used as a material for the electrical connection because of its low resistivity. However, it is technically difficult to etch copper and copper may easily penetrate or diffuse into the underlying layer such as an insulating film and accordingly, a problem arises such that the reliability of the resulting device is lowered.

To solve this problem, such diffusion of the copper has conventionally been prevented by forming a metal thin film (or a conductive barrier film) on the inner wall surface of the interlayer-connecting holes in a multi-layered electrical connection structure according to, for instance, the CVD technique; and then forming a layer for making the electrical connections by the application of a copper thin film on the conductive barrier film so that the resulting copper thin film never comes in direct contact with the underlying insulating film such as a silicon oxide film.

In this case, it has been required that fine contact holes, trenches or the like each having a high aspect ratio should be plugged or filled up with a thin barrier film while ensuring a high rate of step-coverage, with the foregoing demands for the use of electrical connections having a multi-layered structure and a further miniaturized pattern.

Under such circumstances, there has been proposed, for instance, a method for forming a barrier film having a desired thickness, according to the ALD technique which comprises the steps of raising the temperature of a substrate introduced into a vacuum chamber to a predetermined level; introducing one of a nitrogen atom-containing gas and a high-melting metal-containing gas into the chamber to thus make the same adsorb on the substrate; vacuum-evacuating the same gas; then introducing the other gas into the chamber to thus make them react with one another on the substrate; vacuum-evacuating the other gas introduced; and repeating the foregoing steps to thus form, on the substrate, a laminate of a plurality of metal nitride thin films each having a thickness roughly corresponding to one atom (hereunder referred to as "mono-atomic layer") (see, for instance, Japanese Un-Examined Patent Publication Hei 11-54459 (for instance, claim 1));

Moreover, there has also been known a method for forming a barrier layer, which comprises the step of depositing a layer of a material such as Ta, TiN or TaN using, for instance, the ALD technique (see, for instance, Japanese Un-Examined Patent Publication 2004-6856 (Claims and the like)).

The foregoing ALD technique is similar to the CVD technique in that it makes use of a chemical reaction between two or more kinds of precursors. However, these techniques differ from one another in that the usual CVD technique makes use of such a phenomenon that the different kinds of precursors in their gaseous states come in close contact with one another to thus make them chemically react with one another, while the ALD technique makes use of a surface reaction between the two kinds or the different kinds of precursors. More specifically, the ALD technique comprises the step of supplying a kind of precursor (for instance, a reactant gas) onto the surface of a substrate on which another kind of precursor (such as a raw gas) has been adsorbed in advance to bring these two kinds of precursors into contact with one another and make them react with one another on the surface of the substrate and to thus form a desired metal film. In this case, the reaction between the precursor initially adsorbed on the substrate surface and the precursor subsequently supplied onto the surface proceeds, on the substrate, at a quite high rate. The precursors usable herein may be in any state such as a solid, liquid or gaseous state and the raw gas is supplied while using a carrier gas such as $N_2$ or Ar. As has been discussed above, this ALD technique is a method for forming a mono-atomic thin film by repeating the step for adsorbing the raw gas on the substrate and the step for making the adsorbed raw gas react with the reactant gas alternatively. In other words, this technique can ensure an excellent rate of step coverage since the adsorption and the reaction always take place within the superficial dynamic region and further this technique permits the improvement of the density of the resulting film since the raw gas and the reactant gas are reacted with one another while separately introducing them into the reaction zone. For this reason, this technique has become of major interest lately.

The conventional mono-atomic layer-deposition apparatus (ALD apparatus) for forming a thin film according to the foregoing ALD technique consists of a film-forming apparatus provided with a vacuum evacuation means and the film-forming apparatus further comprises a substrate-mounting stage equipped with a heating means and a gas-introducing means arranged on the ceiling of the apparatus, which is opposed to the substrate-mounting stage. As an example of such an ALD apparatus, there has been known one having such a construction that a desired raw gas and a reactant gas are introduced into the apparatus through the gas-introducing means while setting a predetermined time lag between their introduction times to thus repeatedly carry out the raw gas-adsorption step and the reaction step in which the raw gas is reacted with the reactant gas by the aid of the plasma for the preparation of a thin film having a desired thickness (see, for instance, Japanese Un-Examined Patent Publication 2003-318174 (Claims and the like)).

DISCLOSURE OF THE INVENTION

Problems that the Invention is to Solve

In the case of the foregoing conventional technique, when using a gas consisting of a tantalum atom-containing organo-metal compound as the raw gas, the resulting tantalum nitride film has high contents of C and N atoms, while the compositional ratio of Ta to N: Ta/N is low. For this reason, a problem arises, such that it is difficult to form a tantalum nitride (TaN)

film having a low resistance and useful as a barrier layer, while ensuring the adherence to the Cu film used for forming electrical connections. To solve this problem, it would be necessary to develop a film-forming process which can break organic groups such as alkyl groups present in the raw gas used through the cleavage thereof to thus reduce the content of C and simultaneously break the linkages between Ta and N and to thus increase the compositional ratio: Ta/N.

Accordingly, it is an object of the present invention to solve the foregoing problems associated with the conventional techniques and more specifically to provide a method for forming a tantalum nitride film which has a low resistance, whose contents of C and N atoms are low, which has a high compositional ratio: Ta/N, which can ensure sufficiently high adherence to the electrical connection-forming film (such as Cu-electrical connection-forming film) and which is thus useful as a barrier film.

Means for the Solution of the Problems

The tantalum nitride film-forming method according to the present invention is characterized in that it comprises the steps of introducing a raw gas consisting of a coordination compound constituted by an elemental tantalum (Ta) having a coordinated ligand represented by the general formula: N=(R, R') (in the formula, R and R' may be the same or different and each represents an alkyl group having 1 to 6 carbon atoms), and a halogen gas into a vacuum chamber; and reacting these components with one another on a substrate to thus form a surface adsorption film comprising a mono-atomic or multi (several)-atomic layer and composed of a compound represented by the following general formula: $TaN_x(Hal)_y(R, R')_z$ (in the formula, Hal represents a halogen atom), then introducing radicals generated from a gas of an H atom-containing compound to thus remove N of Ta—N bonds present in the resulting compound through breakage thereof and remove, at the same time, the remaining R(R') groups bonded to the N atoms present in the compound through the cleavage thereof and to thus form a tantalum nitride film rich in tantalum atoms. In this connection, if the number of carbon atoms included in the foregoing coordination compound exceeds 6, a problem arises such that the carbon content of the resulting film increases.

In the foregoing tantalum nitride film-forming method, when introducing the raw gas and the halogen gas into the vacuum chamber, it is possible that the raw gas is first introduced into the chamber to adsorb the raw gas on the surface of the substrate and the halogen gas is then introduced into the chamber and reacted with the raw gas adsorbed on the substrate to thus form the surface adsorption film comprising the mono-atomic or multi (several)-atomic layer and composed of the compound of the formula: $TaN_x(Hal)_y(R, R')_z$; or that both of these gases are simultaneously introduced into the chamber to make them react with one another on the substrate and to thus form the surface adsorption film comprising the mono-atomic or multi (several)-atomic layer and composed of the compound of the formula: $TaN_x(Hal)_y(R, R')_z$. In this case, a thin film having a desired film thickness can be prepared by alternatively repeating the foregoing adsorption and reaction steps over predetermined times.

The method of the present invention comprising the foregoing steps would thus permit the formation of a tantalum nitride film whose contents of C and N atoms are reduced, whose Ta/N compositional ratio increases, which can ensure the satisfactory adherence to a Cu film and which is thus useful as a barrier layer for the Cu-electrical connections and which is rich in tantalum and has a low resistance.

The foregoing raw gas is desirably a gas of at least one coordination compound selected from the group consisting of penta-dimethylamino-tantalum (PDMAT), tert-amylimido-tris(dimethylamide) tantalum (TAIMATA), penta-diethylamino-tantalum (PEMAT), tert-butylimido-tris-(dimethylamide) tantalum (TBTDET), tert-butylimido-tris(ethylmethyl-amide) tantalum (TBTEMT), $Ta(N(CH_3)_2)_3(NCH_2CH_3)_2$ (DEMAT) and $TaX_5$ (X represents a halogen atom selected from the group consisting of chlorine, bromine and iodine atoms).

The foregoing halogen gas is desirably at least one member selected from the group consisting of fluorine, chlorine, bromine and iodine gases. The use of such a halogen gas would permit the formation of the foregoing compound of the formula: $TaN_x(Hal)_y(R, R')_z$.

The foregoing hydrogen atom-containing gas is desirably at least one member or gas selected from the group consisting of $H_2$, $NH_3$ and $SiH_4$ gases.

The foregoing method for forming a tantalum nitride film would permit the preparation of a thin film rich in tantalum and having a low resistance, which satisfies the following requirement: the compositional ratio of tantalum to nitrogen present in the film: $Ta/N \geq 2.0$.

The method for forming a tantalum nitride film according to the present invention is characterized in that it comprises the steps of forming a tantalum nitride film according to the foregoing film-forming method; and then implanting tantalum particles into the resulting tantalum nitride film according to the sputtering technique which makes use of a target containing tantalum as the principal constituent component. This method would permit the formation of a tantalum nitride film further rich in tantalum and sufficiently satisfying the foregoing requirement: $Ta/N \geq 2.0$.

In this connection, it is also possible that after alternatively repeating the foregoing adsorption and reaction steps over a plurality of times, tantalum particles are implanted into the resulting tantalum nitride film according to the sputtering technique which makes use of a target containing tantalum as the principal constituent component. Alternatively, the foregoing adsorption and reaction steps and the foregoing step for the implantation of tantalum particles into the resulting tantalum nitride film according to the sputtering technique which makes use of a target containing tantalum as the principal constituent component are alternatively repeated over a plurality of times. The repetition of the sputtering step permits the improvement of the adhesiveness of the resulting barrier film and the removal of impurities such as carbon. According to another embodiment, it is also possible to carry out the step for implanting tantalum particles into the resulting tantalum nitride film according to the sputtering technique which makes use of a target containing tantalum as the principal constituent component, during the implementation of the foregoing adsorption and reaction steps.

The sputtering step is desirably carried out while controlling the DC power and the RF power of the sputtering device in such a manner that the DC power is low, while the RF power is high.

Effects of the Invention

The present invention thus permits the formation of a tantalum nitride film having a low resistance, whose contents of C and N atoms are low, which has a high compositional ratio: Ta/N, which can ensure sufficiently high adherence to the electrical connection-forming film (such as Cu-electrical connection-forming film) and which is thus useful as a barrier film.

BEST MODE FOR CARRYING OUT THE INVENTION

According to the present invention, the intended tantalum nitride film having a low resistance, whose contents of C and N atoms are low, and which has a high compositional ratio: Ta/N, can be prepared by reacting a raw gas composed of the foregoing tantalum atom-containing coordination compound with a halogen gas in a vacuum chamber to form a compound of the formula: $TaN_x(Hal)_y(R, R')_z$ on the substrate, and then further reacting the resulting compound with radicals generated from an H atom-containing compound, i.e. radicals as H radicals derived from $H_2$ gas or $NH_3$ gas or $NH_r$ radicals derived from $NH_3$ gas.

Regarding the introduction of the foregoing raw gas, halogen gas and H atom-containing gas into the vacuum chamber, each of the foregoing gases listed above may directly be introduced into the vacuum chamber by itself or it may likewise be introduced into the same along with an inert gas such as $N_2$ gas or Ar gas. With respect to the amounts of these reactants relative to that of the raw gas, the halogen gas is used in a flow rate of, for instance, not more than 5 sccm per 5 sccm of the raw gas; and the H atom-containing gas is used in a flow rate higher than that of the halogen gas and more specifically in a flow rate ranging from 100 to 1000 sccm (as expressed in terms of the flow rate of $H_2$) per 5 sccm of the raw gas.

The reaction temperature used in the foregoing two reactions is not restricted to any specific one insofar as it can initiate these reactions and, for instance, it is in general not more than 300° C. and preferably 150 to 300° C. for the reaction of the raw gas with the halogen gas; and it is in general not more than 300° C. and preferably 150 to 300° C. for the reaction of the halogenated product of the foregoing reaction with the radicals derived from a hydrogen atom-containing compound. In this case, if the step for adsorbing the raw gas on the substrate is carried out at a temperature of not more than 20° C., the adsorbed amount thereof increases and as a result, a desired tantalum nitride film can be formed at an improved film-forming rate. In addition, it is desirable that the pressure in the vacuum chamber ranges from 1 to 10 Pa for the initial halogenation reaction and that it ranges from 1 to 100 Pa for the subsequent film-forming reaction.

As has been discussed above, the coordination compound is one constituted by an elemental tantalum (Ta) having a coordinated ligand represented by the general formula: N═(R, R') (in the formula, R and R' may be the same or different and each represents an alkyl group having 1 to 6 carbon atoms). The alkyl group may be, for instance, a linear or branched one such as a methyl, ethyl, propyl, butyl, pentyl or hexyl group. The coordination compound is in general one constituted by an elemental tantalum (Ta) having 4 or 5 coordinated ligands represented by the formula: N—(R, R').

The foregoing method of the present invention may be carried out, for instance, by adsorbing a raw gas on a substrate within a vacuum chamber, subsequently introducing a halogen gas into the chamber to thus form $TaN_x(Hal)_y(R, R')_z$ compound through a halogenation reaction, then introducing H radicals generated from a hydrogen atom-containing compound into the chamber to thus form a tantalum nitride film and thereafter, repeating these processes over desired times; or the method may be carried out by repeating adsorption and halogenation steps over desired times in a vacuum chamber, then introducing H radicals into the vacuum chamber to thus form a tantalum nitride film and then repeating these steps over predetermined times; or the method may likewise be carried out by simultaneously introducing a raw gas and a halogen gas into a vacuum chamber to thus make them react with one another on a substrate, then introducing radicals into the chamber to thus form a tantalum nitride film and subsequently repeating these steps over predetermined times.

The method for preparing a tantalum nitride film according to the present invention can be carried out in any film-forming apparatus, inasmuch as it can be used for the practice of the so-called ALD method. For instance, such an apparatus may be a film-forming apparatus, for instance, that as shown in FIG. 1, in which a thin film can be formed on the surface of a substrate within a vacuum chamber and which is provided with a raw gas-introducing system for the introduction of a raw gas containing tantalum as a constituent element of the thin film, a halogen gas-introducing system for the introduction of a halogen gas, and a reactant gas-introducing system for the introduction of a reactant gas. Moreover, it is also possible to use a film-forming apparatus as shown in FIG. 4, which is a variation of the film-forming apparatus detailed above. The foregoing reactant gas-introducing system is preferably equipped with a radical-generation device for forming the radicals of the reactive gas and the radicals may be generated according to either a so-called plasma-enhanced method or a catalytic method.

Incidentally, in the method for preparing a tantalum nitride film according to the present invention, it is necessary to carry out a known degassing treatment for the removal of impurities such as gases adhered to the surface of a substrate prior to the formation of such a barrier film, and an electrical connection-forming film of, for instance, Cu is finally formed after such a barrier film is formed onto the substrate. For this reason, if this film-forming apparatus is incorporated into a composite type electrical connection film-forming apparatus which is so designed that the film-forming apparatus is connected to at least the degassing chamber and an electrical connection film-forming chamber through a conveying chamber capable of being evacuated to a vacuum and that a transport robot can convey the substrate from the conveying chamber to the film-forming chamber (apparatus), the degassing chamber and the electrical connection film-forming chamber, a series of steps extending from the pre-treatment step to the electrical connection film-forming step can be implemented in this apparatus.

Now, an embodiment of the method of the present invention will hereunder be described in detail with reference to the apparatus as shown in FIGS. 1 and 4 in line with the procedures depicted in the flow diagrams as shown in FIGS. 2 and 5.

In FIG. 1, a substrate holder 13 for mounting a substrate 12 is disposed below a vacuum chamber 11 of a film-forming apparatus 1. The substrate holder 13 comprises a stage 131 for mounting the substrate 12 and a heater 132 for heating the substrate 12 mounted on the stage.

Regarding the vacuum chamber 11, a raw gas-introducing system 14 is connected to an inlet opening (not shown) formed on the side wall of the vacuum chamber and a halogen gas-introducing system 15 is connected to another inlet opening. Although, the gas-introducing systems 14 and 15 are schematically shown, in FIG. 1, in such a manner that they are vertically arranged on the same side of the vacuum chamber and connected thereto, but they are not limited in their connected portions on the side of the chamber at all and they may likewise be horizontally arranged on the side thereof inasmuch as they may permit the achievement of the desired or intended purposes. The raw gas is a gas of an organometal compound containing, in its chemical structure, a metallic constituent element (Ta) serving as a raw material for a barrier film to be formed or deposited on the substrate 12. The raw gas-introducing system 14 is composed of a gas bomb 141 filled with the raw gas, a gas valve 142 and a gas-introducing tube 143 connected to the raw gas-introducing opening through the valve and the system is so designed that the flow rate of the raw gas can be controlled with a mass-flow controller, which is not depicted on this figure. In addition, the halogen gas-introducing system 15 is likewise composed of a gas bomb 151, a gas valve 152, a gas-introducing tube 153 and a mass-flow controller (not shown).

Regarding the raw gas-introducing system 14, a gas bomb filled with the raw gas may be used as has been discussed above, but the system may likewise be so designed that the foregoing organometal compound is accommodated in a container heated to and maintained at a predetermined temperature, an inert gas such as Ar gas serving as a bubbling gas is supplied to the container through, for instance, a mass-flow controller to thus sublimate the raw material, and the raw gas is thus introduced into the film-forming apparatus together with the bubbling gas; or a raw material may be vaporized through, for instance, a vaporizer and the resulting raw gas may then be introduced into the film-forming apparatus.

Moreover, to the vacuum chamber 11, there is connected a reactant gas-introducing system 16 through a reactant gas-introducing opening (not shown) formed on a position different from those of the introduction openings used for the introduction of the raw gas and the oxygen atom-containing gas into the chamber. The reactant gas is a gas such as hydrogen gas or ammonium gas, which can react with the reaction product of the raw gas and the halogen gas to thus make a metal thin film containing, in its chemical structure, tantalum (TaN) deposit on the substrate. This reactant gas-introducing system 16 is not limited in its connected portion on the chamber at all like the raw gas-introducing system 14 and the halogen gas-introducing system 15, inasmuch as it may permit the achievement of the desired or intended purpose and it may, for instance, be connected to the chamber on the same side on which the gas-introducing systems 14 and 15 are arranged.

This reactant gas-introducing system 16 is composed of a gas bomb 161 filled with a reactant gas, a gas valve 162, a gas-introducing tube 163 connected to the reactant gas-introducing opening through the valve and a radical-generation device 164 positioned between the gas valve 162 and the reactant gas-introducing opening and the system is further connected to a mass-flow controller, which is not depicted on this figure. The gas valve 162 is opened to thus guide the reactant gas accommodated in the gas bomb 161 to the radical-generation device 164 through the gas-introducing tube 163 for the generation of radicals within the radical-generation device 164. The radicals thus generated are then introduced into and guided to the vacuum chamber 11.

Incidentally, with respect to the interrelation between the raw gas-introducing, oxygen atom-containing gas-introducing and reactant gas-introducing openings, it is desirable that all of these gas-introducing openings are formed at positions in the proximity to the substrate holder 13 in order to make the raw gas and the halogen gas react with one another on the surface of the substrate 12 and to likewise make the resulting reaction product and the reactant gas react with one another for the formation of a desired barrier film. Accordingly, as shown in FIG. 1, the gas-introducing openings for the raw gas, the halogen gas and the reactant gas are desirably formed on the side of the vacuum chamber 11 and at a level slightly higher than the horizontal level of the surface of the substrate 12. In addition, the gas-introducing systems 14, 15 and 16 may be connected to the vacuum chamber in such a manner that each of the gases is fed to the substrate or the wafer from the upper part thereof.

In addition to the foregoing gas-introducing openings, the vacuum chamber 11 is further provided with an opening (not shown) for the connection thereof to a vacuum evacuation system 17 for the evacuation of the chamber. When evacuating the foregoing raw gas, the halogen gas and the reactant gas from the vacuum evacuation system 17, it is preferred to form the opening for the evacuation at a position in the proximity to the substrate holder 13 in order to prevent the contamination of the wall surface of the vacuum chamber due to any flow of these gases towards the top plate of the chamber as low as possible and to evacuate the chamber to a vacuum as high as possible. Accordingly, as will be clear from FIG. 1, the opening for the evacuation is preferably formed on the bottom surface of the vacuum chamber 11.

The present invention will hereunder be described in line with the procedures depicted on the flow diagrams as shown in FIG. 2, which is herein given for explaining an embodiment of the process for forming a tantalum nitride film while making use of the film-forming apparatus as shown in FIG. 1.

After the completion of any pre-treatment of the surface of the substrate 12 such as a degassing treatment, the substrate 12 is introduced into the film-forming apparatus 1 which has been evacuated to a vacuum such as a known pressure level by the operation of the vacuum evacuation system 17 (S1). On the substrate, a known underlying adhesive layer may, if necessary, be formed on an insulating layer. For instance, the substrate may be one prepared by applying a voltage to a target while using the usual sputtering gas such as Ar gas to thus generate plasma, and then sputtering the target to thus form a metal thin film on the surface of the substrate, which may serve as an adherent layer on the side of the substrate.

After the introduction of the foregoing substrate 12 into the film-forming apparatus 1, which has been evacuated to a desired pressure, preferably a vacuum on the order of not more than $10^{-5}$ Pa (S1), the substrate is heated to a desired temperature of, for instance, not more than 300° C. using the heater 132 (S2). Thereafter, a purge gas consisting of an inert gas such as Ar or $N_2$ gas is introduced into the film-forming apparatus (S3-1), followed by the introduction, into the film-forming apparatus, of a raw gas (MO gas) consisting of a tantalum-containing organometal compound in the proximity to the surface of the substrate through the raw gas-introducing system 14 to thus adsorb the raw gas on the surface of the substrate (S3-2). Moreover, the gas valve 142 of the raw gas-introducing system 14 is closed to thus stop the introduction of the raw gas and the remaining raw gas is exhausted or discharged through the vacuum evacuation system 17 (S3-3).

Then the supply of the purge gas is stopped and the purge gas remaining in the chamber is exhausted (S3-4).

After the completion of the exhaustion of the purge gas remaining in the chamber, a halogen gas is introduced into the film-forming apparatus 1 in a flow rate of, for instance, not more than 5 sccm through the halogen gas-introducing system 15 (S3-5) to make the same react with the raw gas adsorbed on the substrate and to thus form a compound of the formula: $TaN_x(Hal)_y(R, R')_z$ (S3-6). In this case, if the flow rate of the halogen gas exceeds 5 sccm, the finally obtained barrier film never has a desired sufficiently low resistance value. After the formation of the foregoing compound, the gas valve 152 of the halogen gas-introducing system 15 is closed to thus stop the supply of the gas to the chamber and a purge gas is simultaneously introduced into the chamber to thus purge the halogen gas remaining in the chamber (S3-7) and then the purge gas remaining in the chamber is evacuated through the vacuum evacuation system (S3-8).

While continuing the foregoing vacuum evacuation, radicals of a reactant gas generated in the radical-generation device 164 are introduced into the film-forming apparatus 1 through the reactant gas-introducing system 16 (S3-9) to make the radicals derived from the reactant gas react with the foregoing reaction product adsorbed on the surface of the substrate 12 for a predetermined period of time and to thus decompose the product (S3-10). Then the supply of the reactant gas is stopped by closing the gas valve 162 of the reactant gas-introducing system 16 and the reactant gas remaining in the film-forming apparatus is externally discharged through the vacuum evacuation system 17 (S3-11).

A quite thin metal film or a layer having a thickness of almost mono-atomic order, i.e., a barrier film is formed on the foregoing adhesive layer on the side of the substrate through the foregoing steps comprising a series of steps including the steps S3-1 to S3-11 (S-4).

The foregoing steps S3-1 to S3-11 are repeated over desired times till the thickness of the barrier film reaches a predetermined level (S-5) to thus form a tantalum nitride film serving as a barrier film having an intended resistance value.

The substrate which has been provided thereon with a tantalum nitride film having a desired thickness may, if necessary, further be treated by applying a voltage to a target while using a sputtering gas such as Ar gas to thus generate plasma and then sputtering the target according to the usual sputtering technique to thus form a metal thin film or an adhesive layer on the side of an electrical connection-forming film (an underlying layer on the side of the barrier film), on the surface of the foregoing tantalum nitride film (S6).

A laminated film is formed on the substrate 12 through the foregoing steps. Subsequently, the electrical connection-forming film is formed on the foregoing adhesive layer on the side of the electrical connection-forming film. The gas flow sequence on the basis of the flow diagram as shown in FIG. 2 is shown in FIG. 3.

FIG. 4 shows another film-forming apparatus used for the practice of the tantalum nitride film-forming method according to the present invention and this apparatus is so designed that it further comprises a sputtering target in addition to the components of the apparatus as shown in FIG. 1 so as to be able to simultaneously carry out a sputtering treatment. The same constituent elements used in the apparatus shown in FIG. 1 are represented by the same reference numerals and the detailed description thereof will accordingly be omitted herein.

Above the vacuum chamber 11, there is disposed a target 18 at the position opposite to the substrate holder 13. The target 18 is connected to a voltage-applying device 19 for generating plasma of a target-constituting material and for emitting particles of the material upon sputtering the same with a sputtering gas. In this connection, the target 18 is composed of a material mainly comprising a metallic constituent element (Ta) included in the foregoing raw gas. The voltage-applying device 19 comprises a DC voltage-generation device 191 and an electrode 192 connected to the target 18. This voltage-applying device may be one which can superimpose DC and AC voltages. Moreover, the voltage-applying device may be one in which a high frequency-generation device is connected to the substrate holder and a bias voltage can thus be applied to the target.

Moreover, to the vacuum chamber 11, there is connected a sputtering gas-introducing system 20 through an opening (not shown) formed on the position different from those of the introduction openings used for the introduction of the raw gas, the halogen gas and the reactant gas into the chamber. It is sufficient that the sputtering gas is any known inert gas such as argon gas and xenon gas. This sputtering gas-introducing system 20 is composed of a gas bomb 201 filled with such a sputtering gas, a gas valve 202, a gas-introducing tube 203 connected to the sputtering gas-introducing opening through this valve and a mass-flow controller (not shown).

Incidentally, with respect to the interrelation between the raw gas-introducing, halogen gas-introducing and reactant gas-introducing openings, it is desirable, as has been discussed above, that all of these gas-introducing openings are formed at positions in the proximity to the substrate holder 13 in order to form a desired barrier film through a desired reaction on the surface of the substrate 12. On the other hand, the foregoing sputtering gas-introducing opening is desirably formed at a position on the chamber in the proximity to the target 18 since the sputtering gas to be introduced into the chamber through the opening is used for the generation of the plasma thereof through the sputtering of the target.

Moreover, it is desirable that the gas-introducing openings for introducing the raw gas, the halogen gas and the reactant gas be formed at positions on the chamber which are spaced apart from the target 18 in order to prevent any contamination of the target 18 due to the introduction of the raw gas, the halogen gas and the reactant gas. Moreover, it is desirable that the opening for introducing the sputtering gas be formed at a position on the chamber which is spaced apart from the substrate holder 13, to inhibit any diffusion, towards the target 18, of the raw gas, the halogen gas and the reactant gas, due to the action of the sputtering gas. Accordingly, as shown in FIG. 4, the gas-introducing openings for the raw gas, the halogen gas and the reactant gas are desirably formed on the side of the vacuum chamber 11 and at a level slightly higher than the horizontal level of the surface of the substrate 12, while the opening for introducing the sputtering gas is desirably formed on the side of the vacuum chamber 11 and at a level slightly lower than the horizontal level of the surface of the substrate 12.

Furthermore, when evacuating the foregoing raw gas, the halogen gas and the reactant gas from the vacuum evacuation system 17, it is preferred to form the opening for the evacuation in the proximity to the substrate holder 13 and at a position on the chamber which is spaced apart from the target 18, in order to prevent any contamination of the target 18 due to any flow of these gases towards the target 18. Accordingly, as will be clear from FIG. 4, the opening for the evacuation is preferably formed on the bottom surface of the vacuum chamber 11.

As has been described above in detail, the film-forming apparatus as shown in FIG. 4 permits the film-formation by the sputtering and the film-formation through the reaction of a raw gas, a halogen gas and a reactant gas on a heated substrate within a single vacuum chamber 11.

FIG. 5 is a flow diagram for the illustration of an embodiment of the process for forming a laminated film using the film-forming apparatus as shown in FIG. 4. The flow diagram will hereunder be described in more detail with reference, in particular, to the points different from those shown in the flow diagram (FIG. 2).

After the completion of any pre-treatment of the surface of the substrate 12 such as a degassing treatment carried out according to any known method, the substrate 12 is introduced into the film-forming apparatus 1 which has been evacuated to a desired vacuum by the operation of the vacuum evacuation system 17 (S1).

After the introduction of the foregoing substrate 12 into the film-forming apparatus 1, it is, if necessary, also possible that a sputtering gas such as Ar gas is introduced into the chamber through the sputtering gas-introducing system 20 (S2) and a voltage is applied to the target 18 by the operation of the voltage-applying device 19 to thus generate plasma (S3) for the sputtering of the target 18 with the plasma particles to thus form a metal thin film or an adhesive layer on the side of the substrate (an underlying layer on the side of the substrate) on the surface of the substrate 12 (S4).

After the completion of the step S4, the substrate 12 is heated to a desired temperature with a heater 132 (S5), followed by the implementation of the steps S6-1 to S6-11 in the same manner used above in the implementation of the steps S3-1 to S3-11 as shown in FIG. 2, to thus form a very thin metal film almost identical to a mono-atomic layer or a tantalum nitride film serving as a barrier film on the adhesive layer on the side of the substrate (S7). The foregoing steps S6-1 to S6-11 are repeated over desired times till the thickness of the resulting barrier film reaches a predetermined level (S-8). The gas flow sequence on the basis of the flow diagram as shown in FIG. 5 is similar to that described above in connection with FIG. 3.

Although there is not shown in the flow diagram depicted on FIG. 5, the foregoing steps S6-1 to S6-11 and the introduction of a sputtering gas through the sputtering gas-introducing system 20 may alternatively be repeated over a plurality of times till the resulting film has a desired thickness, upon the formation of the foregoing barrier film in order to improve the adherence of the barrier film and to remove any impurities.

Then, after the completion of the foregoing steps S6-1 to S6-11 or during the practice of these steps, an inert gas such as Ar gas is introduced while inducing discharges to thus sputter the target 18 mainly comprising tantalum as a constituent component of the raw gas and to implant tantalum particles as the sputtering particles in the thin film formed on the substrate 12. Thus, tantalum originated from the target 18 can be implanted into the substrate 12 according to the sputtering technique and therefore, the content of tantalum in the barrier film can further be increased to thus give a tantalum nitride film rich in tantalum and having a desired low resistance value. In this respect, as the raw gas is an organic tantalum compound, the decomposition thereof is accelerated and impurities such as C and N are expelled when the constituent element (tantalum) is incident upon the surface of the substrate 12 according to the foregoing sputtering and as a result, this results in the formation of a low resistant barrier film having a quite low content of impurities.

This sputtering operation is not carried out for the formation of a laminated tantalum film, but for the implantation of tantalum particles in the tantalum nitride film through the bombardment thereof to remove C and N through sputtering and to improve the quality of the film. Accordingly, it is needed that this sputtering must be performed under such conditions which not form any tantalum film, or which permit the etching of the film with tantalum particles. To this end, it would, for instance, be necessary that the sputtering step is carried out while controlling the DC power and the RF power in such a manner that the DC power is low and the RF power is high. For instance, such sputtering conditions which are never accompanied by the formation of any tantalum film can be established when the DC power is set at a level of not more than 5 kW, while the RF power is set at a high level, for instance, ranging from 400 to 800 W. In this connection, the RF power is dependent upon the DC power and therefore, these DC and RF powers are appropriately adjusted so as to control the extent of the improvement of the film quality. In addition, the sputtering temperature may be one usually adopted and it may, for instance, be one identical to that used for the formation of the tantalum nitride film.

After the formation of such a barrier film having a desired thickness on the foregoing substrate according to the foregoing procedures, it is, if necessary, also possible that a sputtering gas such as Ar gas is introduced into the chamber through the sputtering gas-introducing system 20 (S9) and a voltage is applied to the target 18 by the operation of the voltage-applying device 19 to thus generate plasma (S10) for the sputtering of the target 18 according to any known sputtering technique to thus form a metal thin film or an adhesive layer on the side of the electrical connection-forming film (an underlying layer on the side of the barrier film) on the surface of the foregoing barrier film (S11).

A laminated film is thus formed on the substrate 12 through the foregoing steps. Subsequently, the electrical connection-forming film is formed on the foregoing adhesive layer on the side of the electrical connection-forming film.

In this respect, as has been described above, it is desirable for the prevention of any contamination of the target that the raw gas, the halogen gas and the reactant gas are introduced into the reaction chamber, in the foregoing steps, at positions on the chamber which are spaced apart from the target 18. Moreover, it is also desirable that the sputtering gas is introduced into the reaction chamber at a position on the chamber which is spaced apart from the substrate holder 13, to inhibit any diffusion, towards the target 18, of the raw gas, the halogen gas and the reactant gas, due to the action of the sputtering gas.

Furthermore, when evacuating the foregoing raw gas, the halogen gas and the reactant gas through the vacuum evacuation system 17, it is preferred to carry out the evacuation at a position on the chamber which is in the proximity to the substrate holder 13 and which is spaced apart from the target 18, in order to prevent any contamination of the target 18 due to any flow of these gases towards the target 18.

FIG. 6 is a schematic diagram showing the structure of a composite type electrical connection film-forming apparatus equipped with the film-forming apparatus 1 shown in FIG. 1 or 4.

This composite type electrical connection film-forming apparatus 100 is composed of a pre-treatment section 101, a film-forming section 103 and a relay section 102 connecting these sections 101 and 103. Either of these sections should be maintained under desired vacuum atmospheric conditions prior to the implementation of each treatment.

First of all, in the pre-treatment section 101, a substrate free of any treatment and arranged in a transfer chamber 101a is introduced into a degassing chamber 101c by operating a conveyer robot 101b for the pre-treatment section. The untreated substrate is heated in the degassing chamber 101c to thus subject the substrate to a degassing treatment by, for instance, the evaporation of the moisture present on the surface thereof. Then the degassed substrate is transferred to a reduction-treating chamber 101d by the action of the conveyer robot 101b. In this reduction-treating chamber 101d, the substrate is subjected to an annealing treatment in which the substrate is heated while supplying a reducing gas such as hydrogen gas to the chamber to thus remove metal oxides of the underlying electrical connections through the reduction.

After the completion of the annealing treatment, the substrate is withdrawn from the reduction-treating chamber 101d and then transferred to the relay section 102 by the action of the conveyer robot 101b. The substrate is then delivered to a conveyer robot 103a for the film-forming section 103 in the relay section 102.

The substrate thus delivered to the conveyer robot 103a is then introduced into a film-forming chamber 103b by the action of the robot 103a. This film-forming chamber 103b corresponds to the film-forming apparatus 1 described above. In the film-forming chamber 103b, a barrier film and an adhesive layer are formed on the substrate as a laminate film, the substrate provided thereon with the laminate film is then withdrawn from the film-forming chamber 103b and introduced into an electrical connection film-forming chamber 103c, in which an electrical connection-forming film is applied onto the foregoing barrier film (or onto the adhesive layer, if an adhesive layer is formed on the barrier film). After the formation of the electrical connection-forming film, the substrate is transferred from the electrical connection film-forming chamber 103c to a transfer chamber 103d by putting the conveyer robot 103a into operation.

As has been discussed above in detail, the working efficiency can be improved by the use of an apparatus such as the foregoing composite type electrical connection film-forming apparatus 100, in which a series of steps including the barrier film-forming step and those carried out before and after the former, or the degassing step and the electrical connection film-forming steps can be carried out in such a single or the same apparatus.

In this connection, the foregoing composite type electrical connection film-forming apparatus 100 is so designed that the pre-treatment section 101 comprises one each of the degassing chamber 101c and the reduction-treating chamber 101d, while the film-forming section 103 comprises one each of the film-forming chamber 103b and the electrical connection film-forming chamber 103c, but the construction of the apparatus 100 is not restricted to this structure.

Accordingly, for instance, the pre-treatment section 101 and the film-forming section 103 may be so designed that each of them has a polygonal shape, and that a plurality of degassing chambers 101c and reduction chambers 101, or a plurality of film-forming chambers 103b and electrical connection film-forming chambers 103c are arranged on each face, respectively, and this would result in the further improvement of the throughput capacity of the apparatus.

Example 1

In this Example, a tantalum nitride film was prepared according to the procedures shown in the flow diagram depicted in FIG. 2, using the film-forming apparatus 1 shown in FIG. 1, and using pentadimethylamino-tantalum (MO) gas as the raw gas, fluorine gas as the halogen gas and $H_2$ gas as the reactant gas.

After the surface of a substrate 12 provided thereon with an $SiO_2$ insulating film was subjected to a pre-treatment or a degassing treatment according to a known method, the substrate 12 was introduced into the film-forming apparatus 1 which had been vacuum-evacuated to a pressure of not more than $10^{-5}$ Pa by putting the vacuum evacuation system 17 into operation (S1). The substrate used herein is not limited to any particular one, and it may be, for instance, one prepared by applying a voltage to a target, which comprises Ta as a principal constituent, while using Ar gas as a sputtering gas, to thus generate plasma for the sputtering of the target according to the usual sputtering technique to thus form an adhesive layer on the side of the substrate.

After the introduction of the substrate 12 into the film-forming apparatus 1, the substrate 12 was heated to a temperature of 250° C. with the heater 132 (S2). Subsequently, an Ar purge gas was introduced into the apparatus and then the foregoing raw gas was supplied thereto in the proximity to the surface of the substrate, at a flow rate of 5 sccm for 5 seconds through the raw gas-introducing system 14 (S3-1, S3-2). After adsorbing the raw gas on the surface of the substrate 12, the gas valve 142 of the raw gas-introducing system 14 was closed to thus stop the supply of the raw gas and then the raw gas remaining in the apparatus was removed by the evacuation of the apparatus 1 for 2 seconds through the vacuum evacuation system 17 (S3-3).

Then the supply of the Ar purge gas was stopped and then the purge gas remaining in the apparatus was removed by the vacuum evacuation (S3-4).

With the continuation of this vacuum evacuation, fluorine gas was introduced into the film-forming apparatus 1 through the halogen gas-introducing system 15 at a flow rate of 5 sccm for 5 seconds (S3-5) to make the gas react with the raw gas (MO gas) adsorbed on the substrate and to thus form a compound of the formula: $TaN_x(Hal)_y(R,R')_z$ (S3-6). Then the supply of the halogen gas to the chamber was interrupted and a purge gas of Ar is simultaneously introduced into the chamber to thus purge the halogen gas remaining in the chamber (S3-7) and the purge gas was then evacuated from the chamber through the vacuum evacuation (S3-8).

With the continuation of the foregoing vacuum evacuation, $HH_3$ gas or $H_2$ gas was passed through the radical-generation device 164 through the reactant gas-introducing system 16 to thus generate hydrogen radicals, the resulting radicals were guided, at a flow rate of 200 sccm for 5 seconds, to the film-forming apparatus 1 (S3-9) to thus make the radicals react with the reaction product of the foregoing raw gas and the halogen gas present on the surface of the substrate 12 for a predetermined period of time for the decomposition of the product (S3-10).

After the completion of the foregoing reaction, the gas valve 162 of the reactant gas-introducing system 16 was closed to thus stop the supply of the reactant gas and then the reactant gas remaining in the apparatus was removed by the evacuation of the apparatus 1 for 2 seconds through the vacuum evacuation system 17 (S3-11).

A quite thin metal film or a layer having a thickness of almost mono-atomic order, i.e., a barrier film consisting of a tantalum nitride film rich in tantalum was formed on the foregoing adhesive layer on the side of the substrate through the foregoing steps comprising a series of steps including the steps S3-1 to S3-11 (S4).

The foregoing steps S3-1 to S3-11 were repeated over desired times till the thickness of the barrier film reached a predetermined level (S5). The barrier film thus formed was inspected for the composition thereof and it was found that the ratio: Ta/N was 2.0 and the content of C was not more than 1% and that of N was 33%.

By way of comparison, the same procedures used in the foregoing method were repeated except for using a combination of the foregoing raw gas (MO gas) and fluorine gas; and using a combination of the foregoing raw gas, fluorine gas and H radicals (in this connection, the treating time or the time for irradiation with the H radicals was set at 3, 5 or 10 seconds) to thus form comparative films.

The specific resistance (resistivity) $\rho$ ($\mu\Omega\cdot cm$) was calculated for each of the thin films prepared above and the results are plotted on FIG. 7. More specifically, the resistivity was obtained by measuring the sheet resistance (Rs) according to the four point probe method and determining the film thickness (T) by the SEM, followed by the substitution of these data in the following relation: $\rho = Rs \cdot T$.

As will be clear from the data plotted on FIG. 7, the film prepared by reacting (halogenation) the raw gas (MO gas) with a halogen gas (a fluorine gas) and then irradiating, for 5 seconds, the reaction product with a reactant gas (H radicals) was found to have a resistivity value (450μΩ·cm) significantly lower than those observed for the films prepared using a combination of MO gas and fluorine gas (several millions of μΩ·cm) and a combination of MO gas, fluorine gas and H radicals (irradiation time of 3 seconds) (300,000μΩ·cm) and a combination of MO gas, fluorine gas and H radicals (irradiation time of 5 seconds) (4,800μΩ·cm).

The foregoing results would clearly indicate that the formation of a film through the reaction of MO gas with a halogen gas (a fluorine gas) provides a film in an almost insulated state. However, it has been found that, if the film is further treated with H radicals, the resistivity of the resulting film varies with time depending on the irradiation time and that the longer the irradiation treatment time, the smaller the resistivity thereof. This result clearly indicates that the halogen atoms, the R groups, N atoms are effectively removed by the treatment of the film with H radicals preferably for a time of not less than 10 seconds.

As has been discussed above in detail, it would be considered that the foregoing results would likewise clearly indicate that, when forming a film with the use of the MO gas, a halogen gas and radicals, the use of the halogen gas would permit the selective removal of R groups through the partial cleavage of the R—N bonds present in the raw gas (Ta—N—(R, R') bonds) and the subsequent irradiation with H radicals would permit the cleavage of the Ta—N bonds, N-halogen atom bonds and the remaining N—R bonds in the high resistant halogenated Ta atom-containing compound to thus remove the halogen atoms and C and N atoms present in the resulting film and that, as a result, the resulting film has low contents of C and N atoms, a composition rich in Ta and a reduced resistivity value.

As has been described above, the substrate which has been provided thereon with a tantalum nitride film (a barrier film) having a desired thickness may, if necessary, further be treated by applying a voltage to a target, while using Ar gas as a sputtering gas, to thus generate plasma, to sputter the target according to the usual sputtering technique, and to thus form a metal thin film or an adhesive layer on the side of an electrical connection-forming film serving as an underlying layer on the surface of the barrier film (S6).

A Cu-electrical connection-forming film was applied, under the known process conditions, onto the substrate 12 provided thereon with the laminated film thus formed or on the adhesive layer on the side of the barrier film, if such an adhesive layer had been formed on the substrate. In this respect, it was confirmed that the adhesiveness between each neighboring films was excellent.

Example 2

In this Example, a tantalum nitride film was prepared according to the procedures shown in the flow diagram depicted in FIG. 5, using the film-forming apparatus 1 shown in FIG. 4, and using penta-dimethylamino-tantalum (MO) gas as the raw gas, fluorine gas as the halogen gas and $H_2$ gas as the reactant gas.

A substrate 12, whose surface had been subjected to a pre-treatment or a degassing step according to the method used in Example 1, was introduced into the film-forming apparatus 1 which had been vacuum-evacuated to a pressure of not more than $10^{-5}$ Pa by putting the vacuum evacuation system 17 into operation (S1).

After the introduction of the substrate 12, the substrate may, if necessary, be processed by introducing Ar gas as a sputtering gas through the sputtering gas-introducing system 20 (S2), while applying a voltage to a Ta-containing target 18 through the voltage-applying device 19, to thus generate plasma (S3) for the sputtering of the target to thus form, on the surface of the substrate 12, a metal thin film or an adhesive layer on the side of the substrate (S4).

After the completion of the step S4, the substrate 12 was heated to a temperature of 250° C. with the heater 132 (S5). Subsequently, an Ar purge gas was introduced into the apparatus and then the foregoing raw gas was supplied thereto at the position in the proximity to the surface of the substrate, at a flow rate of 5 sccm for 5 seconds through the raw gas-introducing system 14.

A series of the steps S6-1 to S6-11 as shown in FIG. 5 were carried out by the same procedures used in the steps S3-1 to S3-11 described in Example 1 to deposit a quite thin metal film having a size of almost mono-atomic order on the foregoing adhesive layer on the side of the substrate and to thus form a barrier film consisting of a tantalum nitride film rich in tantalum (S7). The time for irradiation with the radicals derived from the reactant gas was set at 10 seconds.

The foregoing steps S6-1 to S6-11 were repeated over desired times till the thickness of the barrier film reached a predetermined level (S8). The tantalum nitride film thus formed was inspected for various properties thereof and it was found that the ratio: Ta/N, the contents of C and N as well as the specific resistance of the resulting thin film were identical to those observed for the thin film prepared in Example 1.

Incidentally, the foregoing steps S6-1 to S6-11 and the introduction of a sputtering gas through the sputtering gas-introducing system 20 may alternatively be repeated over a plurality of times till the resulting film has a desired thickness, upon the formation of the foregoing barrier film, in order to improve the adherence of the barrier film and to remove any impurities.

Then, after the completion of the foregoing steps S6-1 to S6-11 or during the practice of these steps, an inert gas such as Ar gas is introduced while inducing discharges to thus sputter the target 18 comprising tantalum as the main constituent thereof and to implant tantalum particles as the sputtering particles in the thin film formed on the substrate 12. In this respect, the sputtering step was conducted under the following conditions: DC power: 5 kW; RF power: 600 W; and the step was carried out at a sputtering temperature of 250° C.

Thus, the implantation of the tantalum-containing particles into the thin film permitted a further increase in the content of tantalum in the barrier film to thus give a tantalum nitride film rich in tantalum and having a desired low resistance value. In this respect, the decomposition of the raw gas was accelerated and impurities such as C and N were expelled from the barrier film by the impact of such tantalum particles on the substrate 12 and as a result, this resulted in the formation of a low resistant barrier film having a quite low content of impurities. The thin film thus formed was inspected for a variety of properties thereof and it was found that the ratio: Ta/N was 3.4 and the content of C was not more than 0.1% and that of N was 22.7%. In addition, the resulting thin film had a specific resistance value of 250μΩ·cm.

After the formation of such a modified tantalum nitride film having a desired thickness according to the foregoing procedures, it is, if necessary, also possible that a sputtering gas such as Ar gas is introduced into the chamber through the sputtering gas-introducing system 20 (S9) and a voltage is applied to the target 18 by the operation of the voltage-applying device 19 to thus generate plasma (S10) and then the target 18 is sputtered according to any known sputtering technique to thus form a metal thin film or an adhesive layer on the side of the electrical connection-forming film as an underlying layer on the surface of the barrier film (S11).

A Cu-electrical connection-forming film was applied, under the known process conditions, onto the substrate 12 provided thereon with the laminated film thus formed according to the foregoing steps or on the adhesive layer on the side of the electrical connection-forming film, if such an adhesive layer had been formed on the substrate. In this respect, it was confirmed that the adhesiveness between each neighboring films was excellent.

In this respect, as has been described above, it is desirable for the prevention of any contamination of the target that the raw gas, the halogen gas and the reactant gas are introduced into the reaction chamber, in the foregoing steps, at positions on the chamber which are spaced apart from the target 18. Moreover, it is also desirable that the sputtering gas is introduced into the reaction chamber at a position on the chamber which is spaced apart from the substrate holder 13, to inhibit any diffusion, towards the target 18, of the foregoing gases, due to the action of the sputtering gas.

Furthermore, when evacuating the foregoing raw gas, the halogen gas and the reactant gas through the vacuum evacuation system 17, it is preferred to carry out the evacuation at a position on the chamber which is in the proximity to the substrate holder 13 and which is spaced apart from the target 18, in order to prevent any contamination of the target 18 due to any flow of these gases towards the target 18.

Example 3

The same film-forming procedures used in Example 1 were repeated except that tert-amylimido-tris(dimethylamino) tantalum was substituted for the penta-dimethylamino-tantalum used in Example 1 to thus form a low-resistant tantalum nitride film rich in tantalum. The resulting film was inspected for a variety of properties thereof and it was found that the ratio: Ta/N was 1.9 and the content of C was 1% and that of N was 34.5%. In addition, the resulting thin film had a specific resistance value of 550μΩ·cm.

Example 4

The same procedures used in Example 1 were repeated except that chlorine gas, bromine gas or iodine gas was substituted for the fluorine gas used therein as the halogen gas, and that $H_2$ gas was used as the reactant gas for the generation of H radicals, and as a result, the same results observed in Example 1 were likewise obtained in this Example.

INDUSTRIAL APPLICABILITY

The present invention permits the formation of a tantalum nitride film which has a low resistance value, whose contents of C and N atoms are low, which has a high compositional ratio: Ta/N, which can ensure sufficiently high adherence to a Cu film) and which is thus useful as a barrier film. Accordingly, the present invention can be applied to the thin film-forming process in the field of the semiconductor device.

DESCRIPTION OF SYMBOLS

Figure 1:
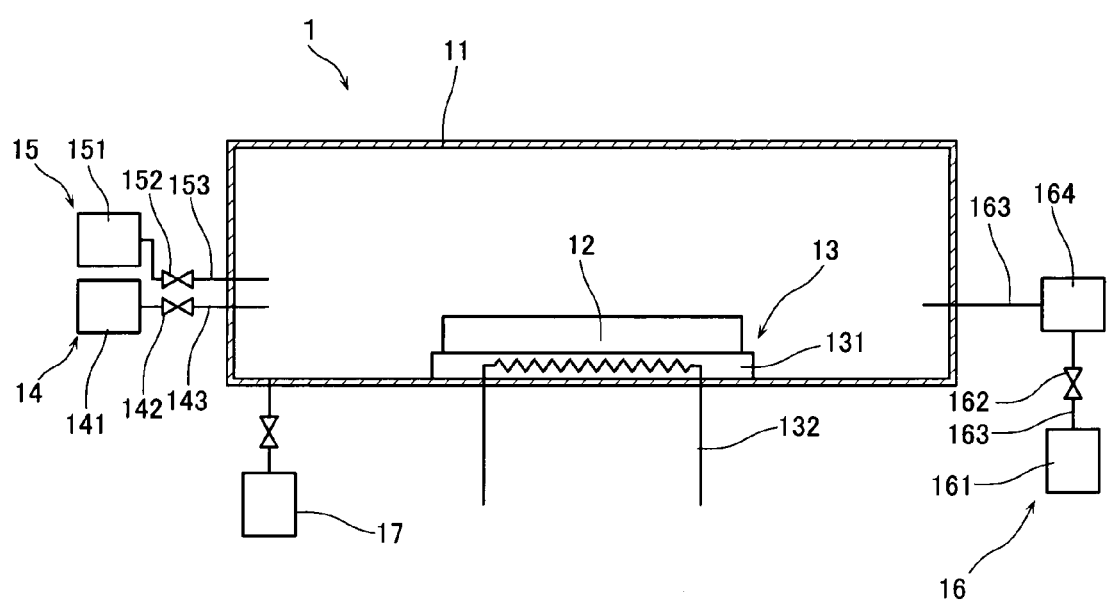
FIG. 1 is a schematic block diagram for illustrating an embodiment of a film-forming apparatus used for practicing the film-forming method according to the present invention.
Figure 2:
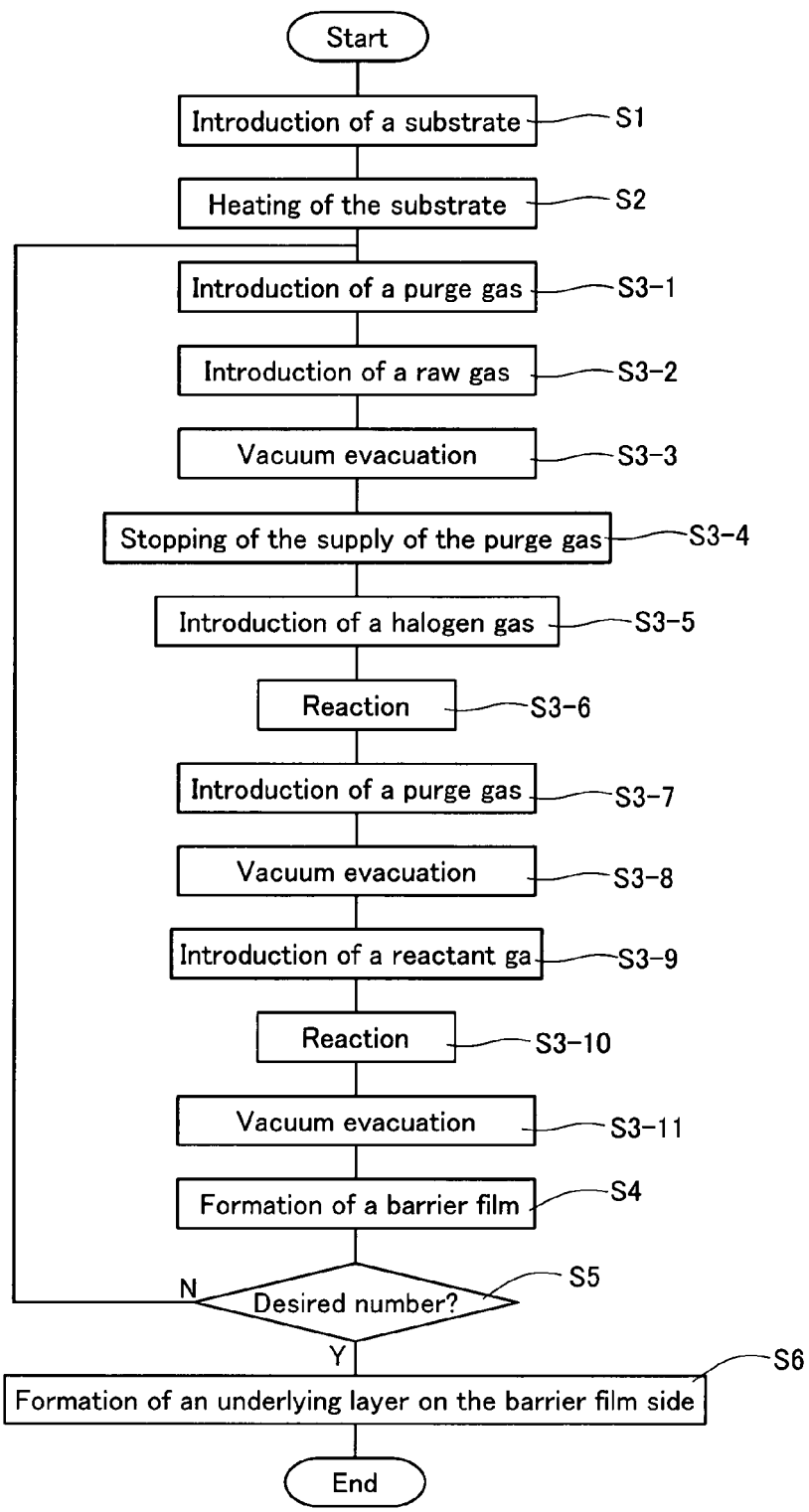
FIG. 2 is a flow diagram for explaining the process for forming a thin film using the apparatus as shown in FIG. 1.
Figure 3:
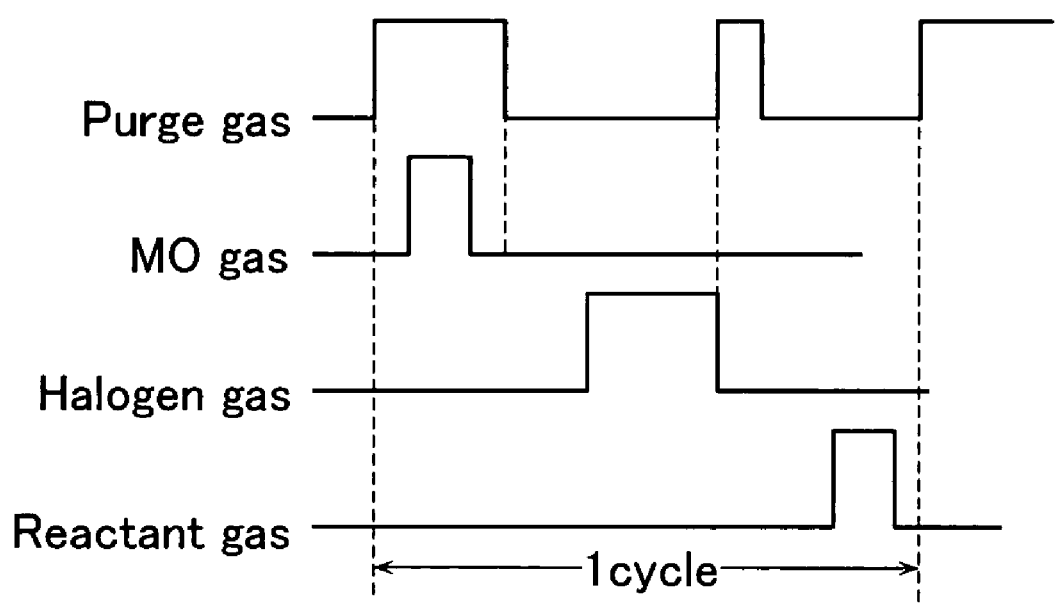
FIG. 3 is a diagram showing the gas flow sequence on the basis of the flow diagram as shown in FIG. 2.
Figure 4:
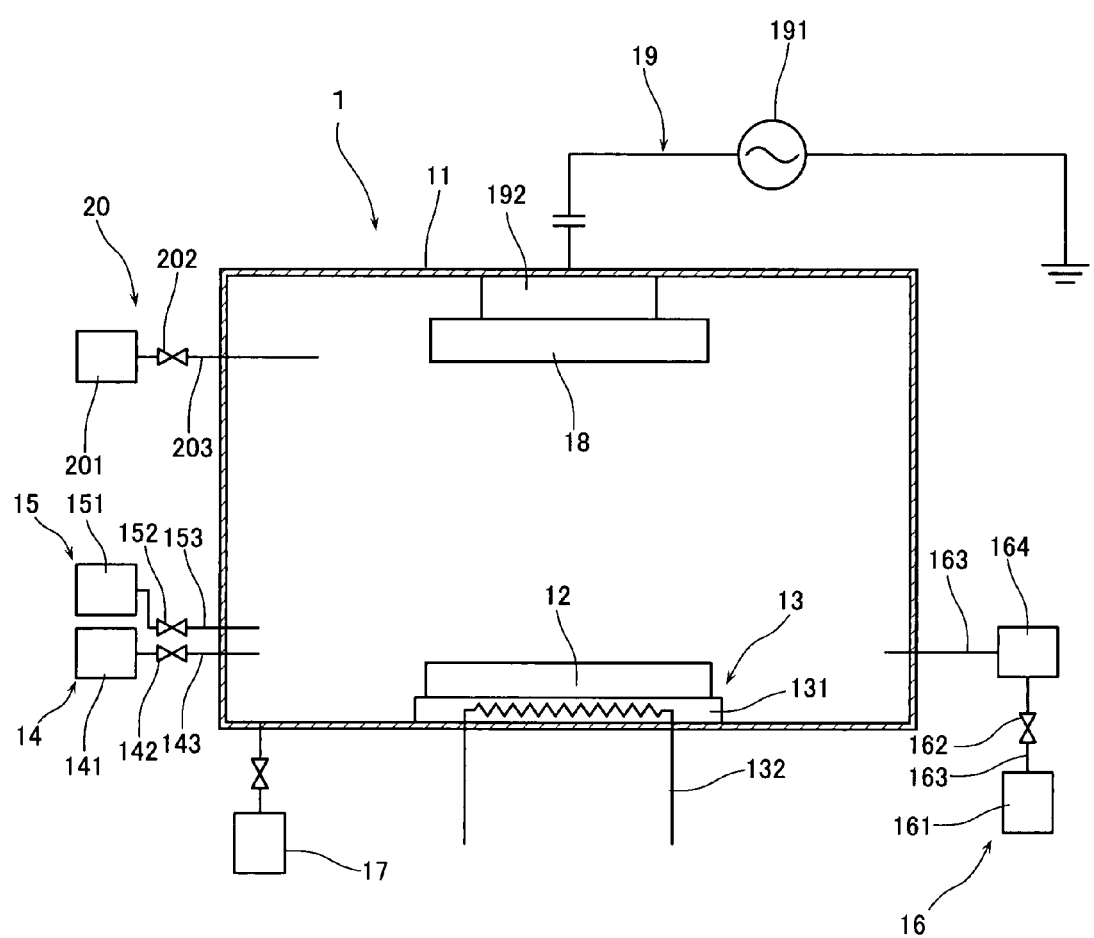
FIG. 4 is a schematic block diagram for illustrating another embodiment of a film-forming apparatus used for practicing the film-forming method according to the present invention.
Figure 5:
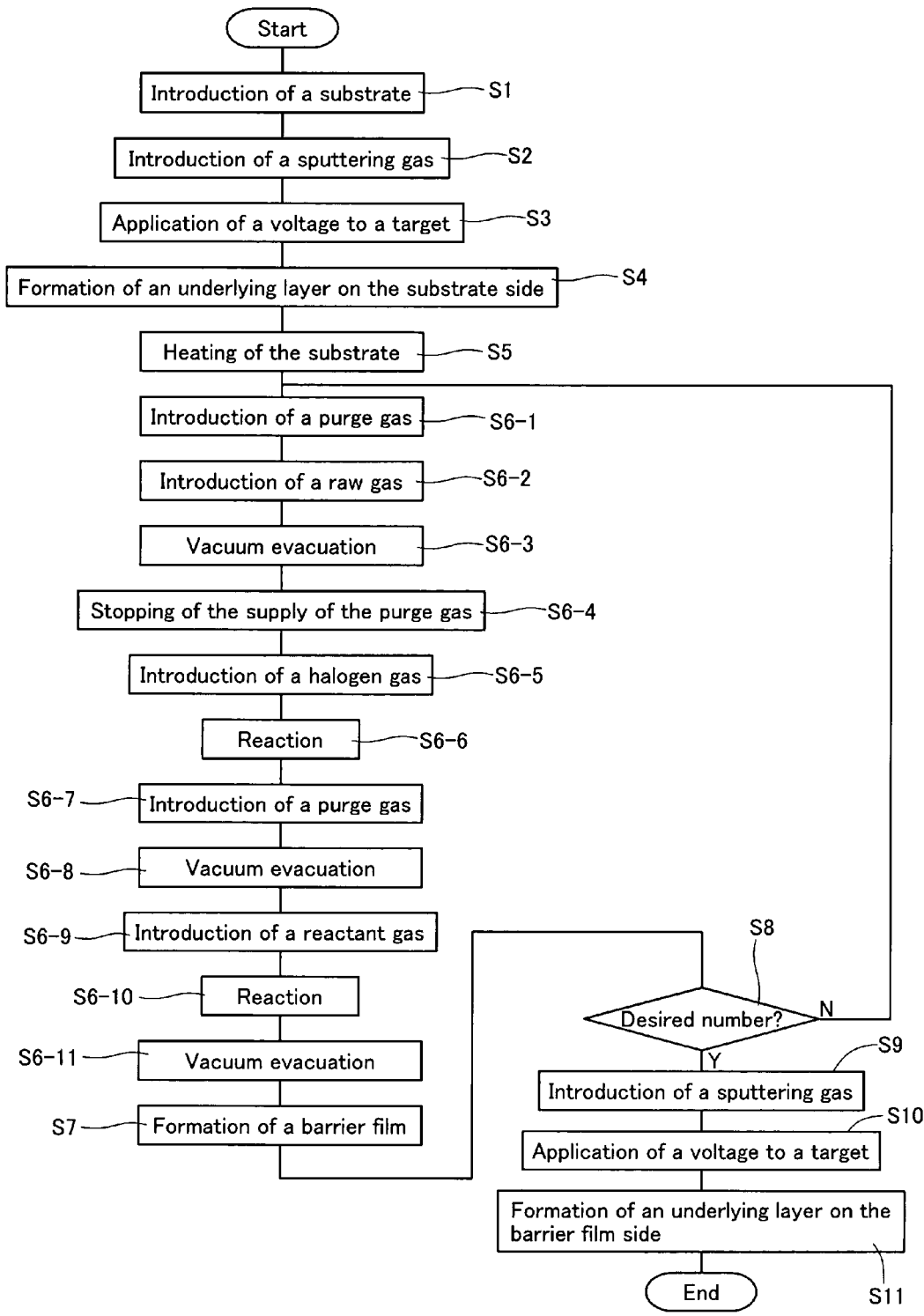
FIG. 5 is a flow diagram for explaining the process for forming a thin film using the apparatus as shown in FIG. 4.
Figure 6:
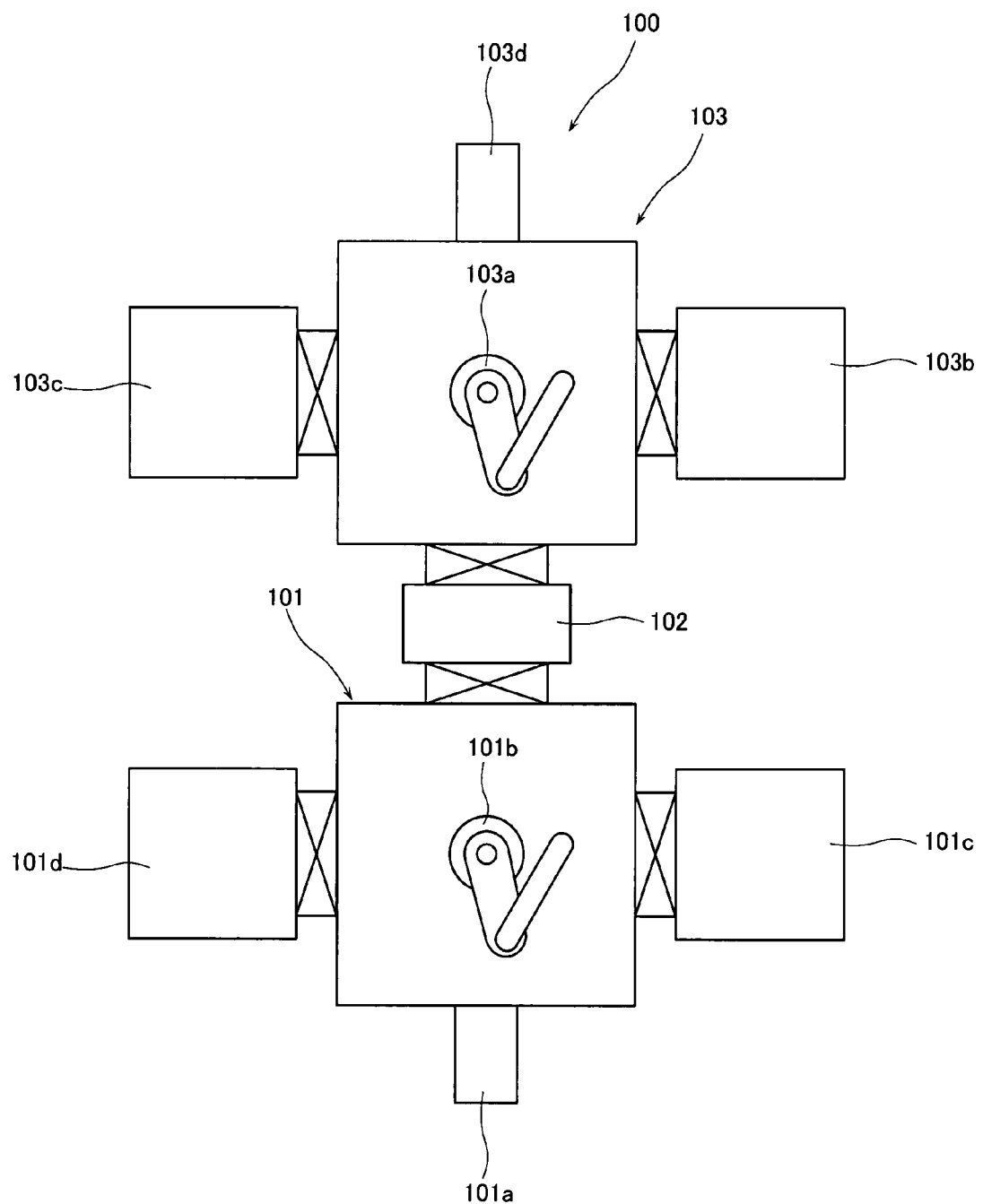
FIG. 6 is a schematic block diagram for illustrating a composite type electrical connection film-forming apparatus provided with a film-forming apparatus, incorporated into the same, used for carrying out the film-forming method according to the present invention.
Figure 7:
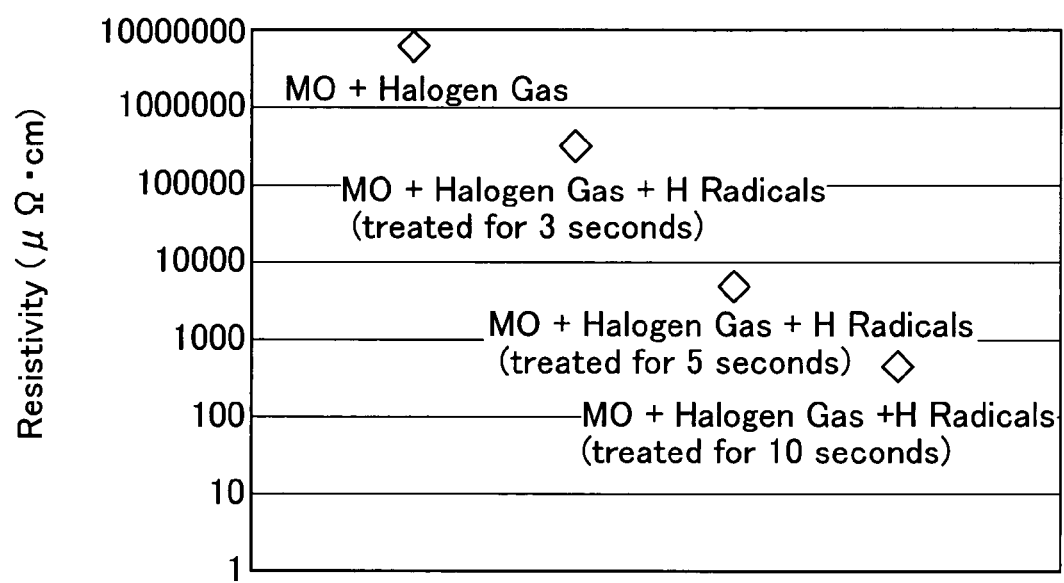
FIG. 7 is a graph on which the resistivity ρ (μΩ·cm) observed for each thin film prepared in Example 1 is plotted.

1 . . . Film-forming apparatus; 11 . . . Vacuum chamber; 12 . . . Substrate; 13 . . . Substrate holder; 14 . . . Raw gas-introducing system; 15 . . . Halogen gas-introducing system; 16 . . . Reactant gas-introducing system; 17 . . . Vacuum evacuation system; 18 . . . Target; 19 . . . Voltage-applying device; 20 . . . Sputtering gas-introducing system; 121 . . . Adhesive layer on the substrate side; 122 . . . Barrier film; 123 . . . Adhesive layer on the electrical connection-forming film.

What is claimed is:

1. A method for forming a tantalum nitride film comprising the steps of introducing a raw gas consisting of a coordination compound constituted by an elemental tantalum (Ta) having a coordinated ligand represented by the general formula: N=(R, R') (in the formula, R and R' may be the same or different and each represents an alkyl group having 1 to 6 carbon atoms), and a halogen gas into a vacuum chamber; and reacting these components with one another on a substrate to thus form a surface adsorption film comprising a mono-atomic or multi (several)-atomic layer and composed of a compound represented by the following general formula: $TaN_x(Hal)_y(R, R')_z$ (in the formula, Hal represents a halogen atom), then introducing radicals generated from a gas of an H atom-containing compound to thus remove Ta—N bonds present in the resulting compound through breakage thereof and remove, at the same time, the remaining R(R') groups bonded to the N atoms present in the compound through the cleavage thereof and to thus form a tantalum nitride film rich in tantalum atoms.

2. The method for forming a tantalum nitride film as set forth in claim 1, wherein the step of introducing the raw gas and the halogen gas into the vacuum chamber comprises an adsorption step wherein the raw gas is first introduced into the vacuum chamber to adsorb the raw gas on the surface of the substrate and the halogen gas is then introduced into the vacuum chamber; and a reaction step wherein the halogen gas is reacted with the raw gas adsorbed on the substrate to thus form the surface adsorption film comprising the mono-atomic or multi (several)-atomic layer and composed of the compound of the formula: $TaN_x(Hal)_y(R')_z$.

3. The method for forming a tantalum nitride film as set forth in claim 1, wherein when introducing the raw gas and the halogen gas into the vacuum chamber, both of these gases are simultaneously introduced into the chamber to make them react with one another on the substrate and to thus form the surface adsorption film comprising the mono-atomic or multi (several)-atomic layer and composed of the compound of the formula: $TaN_x(Hal)_y(R,R')_z$.

4. The method for forming a tantalum nitride film as set forth in any one of claims 1 to 3, wherein the raw gas is the gas of at least one coordination compound selected from the group consisting of penta-dimethyl-amino-tantalum, tert-amylimido-tris (dimethylamide) tantalum, penta-diethyl-amino-tantalum, tert-butylimido-tris (dimethylamide) tantalum, tert-butyl-imido-tris(ethyl-methylamide) tantalum, and $Ta(N(CH_3)_2)_3(N(CH_2CH_3)_2)_2$.

5. The method for forming a tantalum nitride film as set forth in claim 1, wherein the halogen gas is at least one member or a gas selected from the group consisting of fluorine, chlorine, bromine and iodine gases.

6. The method for forming a tantalum nitride film as set forth in claim 1, wherein the hydrogen atom-containing gas is at least one member or a gas selected from the group consisting of $H_2$, $NH_3$ and $SiH_4$ gases.

7. The method for forming a tantalum nitride film as set forth in claim 1, wherein the tantalum nitride film is one which satisfies the following requirement: the compositional ratio of tantalum to nitrogen: $Ta/N \geq 2.0$.

8. A method for forming a tantalum nitride film comprising the steps of forming a tantalum nitride film according to the method as set forth in claim 1; and then implanting tantalum particles into the resulting tantalum nitride film according to a sputtering technique which makes use of a target containing tantalum as the principal constituent component.

9. The method for forming a tantalum nitride film comprising the steps of: forming a tantalum nitride film according to the method set forth in claim 2 wherein the adsorption step and the reaction step are alternately repeated over a plurality of times; and implanting tantalum particles are implanted into the resulting tantalum nitride film according to a sputtering technique which makes use of a target containing tantalum as the principal constituent component.

10. The method for forming a tantalum nitride film as set forth in claim 9, wherein the following steps are alternately repeated over a plurality of times: the adsorption step and the reaction step and the step for implanting tantalum particles into the resulting tantalum nitride film according to the sputtering technique which makes use of a target containing tantalum as the principal constituent component.

11. The method for forming a tantalum nitride film comprising the steps of: forming a tantalum nitride film according to the method set forth in claim 2 and the step for implanting tantalum particles into the surface adsorption film comprising the mono-atomic or multi (several)-atomic layer and composed of the compound of the formula: $TaN_x(Hal)_y(R, R')_z$ according to a sputtering technique which makes use of a target containing tantalum as the principal constituent component, wherein the step for implanting tantalum particles into the surface adsorption film is carried out during the adsorption step and the reaction step.

12. The method for forming a tantalum nitride film as set forth in claim 8, wherein the step of implanting tantalum particles into the resulting tantalum nitride film according to the sputtering technique is carried out while controlling the DC power and the RF power in such a manner that the DC power is low and the RF power is high.

13. The method for forming a tantalum nitride film as set forth in claim 8, wherein the tantalum nitride film formed is one which satisfies the following requirement: the compositional ratio of tantalum to nitrogen: $Ta/N \geq 2.0$.

* * * * *